United States Patent
Mathur et al.

(10) Patent No.: US 6,842,320 B1
(45) Date of Patent: Jan. 11, 2005

(54) HOT-PLUGGABLE OVER-VOLTAGE TOLERANT INPUT/OUTPUT CIRCUIT

(75) Inventors: Manish Kumar Mathur, Bangalore (IN); Gajender Rohilla, Bangalore (IN)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/256,680

(22) Filed: Sep. 26, 2002

(51) Int. Cl.[7] .................................. H02H 3/24
(52) U.S. Cl. ......................... 361/91; 361/90
(58) Field of Search ................ 361/56, 57, 58, 361/90, 91, 91.1, 111, 119; 326/56, 57, 58, 80, 81, 86, 87

(56) References Cited

U.S. PATENT DOCUMENTS

| | | | | |
|---|---|---|---|---|
| 6,005,413 A | * | 12/1999 | Schmitt | 326/81 |
| 6,018,257 A | * | 1/2000 | Hung et al. | 327/112 |
| 6,130,556 A | * | 10/2000 | Schmitt et al. | 326/86 |
| 6,201,428 B1 | * | 3/2001 | Clark | 327/333 |
| 6,300,800 B1 | | 10/2001 | Schmitt et al. | 326/86 |

* cited by examiner

Primary Examiner—Brian Sircus
Assistant Examiner—Danny Nguyen
(74) Attorney, Agent, or Firm—Wagner, Murabito, & Hao LLP (57) ABSTRACT

Embodiments of the present invention provide a drive and biasing circuit for an input/output stage of a device. Embodiments of the present invention provide live-insertion protection by driving and biasing various nodes in the input/output stage. Embodiments of the present invention also provide over-voltage protection by biasing various nodes in the input/output stage during normal and live-insertion operating conditions. Embodiments of the present invention utilize the voltage on the supply and/or voltage present on the input/output terminal to provide the drive and bias voltage levels. Embodiments of the present invention are thus able to turn off current paths and protect various junctions against breakdown during over-voltage and live-insertion operating conditions.

17 Claims, 11 Drawing Sheets

|   | Normal<br>$V_{dd} = 3.3V$<br>$V_{pad} = 0 - 3.3V$ | LIVE INSERTION<br>$V_{dd} = 0V$<br>$V_{pad} = 0 - 3.3V$ |
|---|---|---|
| 3 | $V_{dd}$ | $V_{pad}-2V_t$ |
| 4 | $V_{dd}$ | $V_{pad}-V_d$ |
| 5 | 1.0V | $V_{pad}-2V_t$ |
| 6 | 2.5V | 0V |
| 7 | 1.0V | 0V |
| 8 | 1.0V | $V_{pad}$ |
| 10 | 2.5V | $V_{pad}-2V_t$ |

HOT-PLUGGABLE OVER-VOLTAGE TOLERANT INPUT/OUTPUT CIRCUIT

FIELD OF THE INVENTION

Embodiments of the present invention relate to electronic devices, and more particularly to over-voltage and/or live-insertion protection for input/output circuits.

BACKGROUND OF THE INVENTION

As semiconductor device technology has progressed, the device geometries have shrunk. Decreasing the geometries have increased the density of the devices, reduced the cost of the devices, while increasing the speed of the devices. However, as oxide layer thickness are decreased the electric field per unit area increases significantly for a given supply voltage. Meanwhile, the breakdown-voltage for the dielectric remains relatively the same. As a result it has become necessary to reduce the maximum junction breakdown voltage for integrated semiconductor devices. However, the power supply voltage and/or the input/output levels (determined by specifications, standards, protocols, and the like) typically lag behind by one generation.

For example, an integrated semiconductor device may be fabricated such that the maximum source-to-gate, drain-to-gate, and drain-to-source junction voltage cannot exceed 2.75V. However, the supply voltage provided to the device is 3.3V. Thus, if the supply voltage appears across a junction of a device, the device could be damaged.

In the conventional art, electronic devices are also often replaced. For example a card may go bad and need to be replaced with another card, or an older card may need to be upgraded to a newer card. Typically, replacing electronic devices requires powering down the system to which it is attached prior to removing old devices and/or installing the new device. However, powering down the system results in the entire system not being available for use while a device providing a particular function is removed and or installed.

Figure 1A:
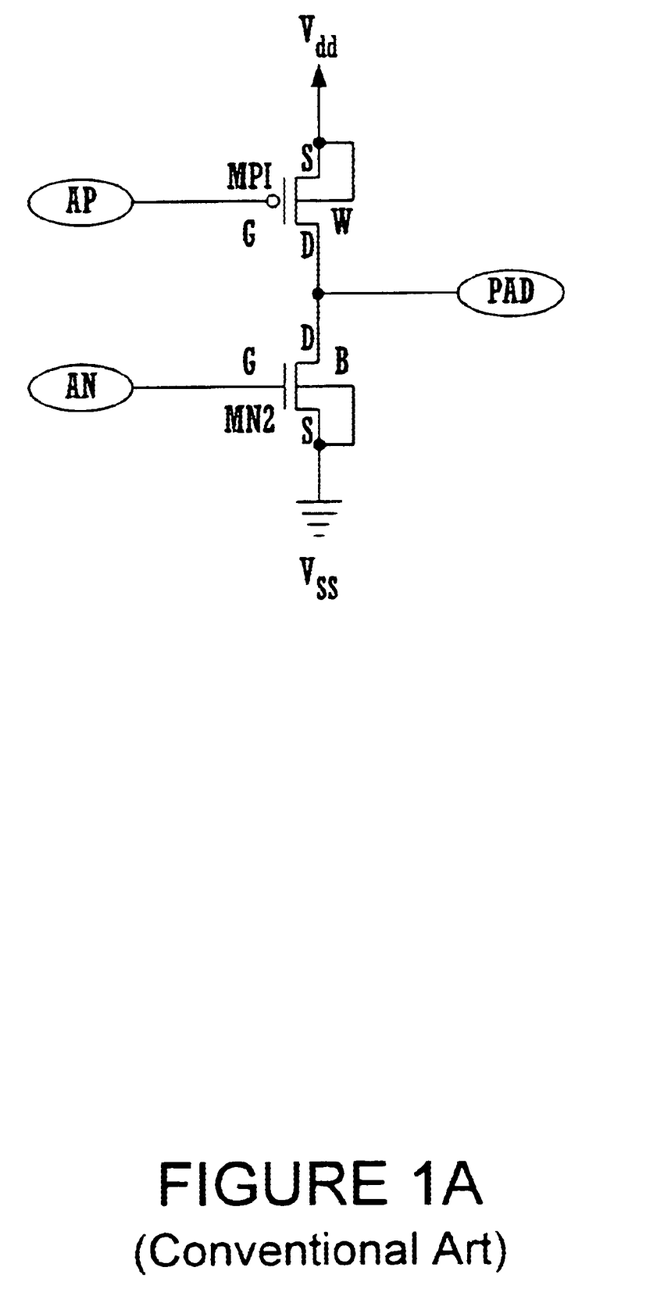
FIG. 1A shows a circuit diagram of a simplified input/output stage according to the conventional art.
Figure 1B:
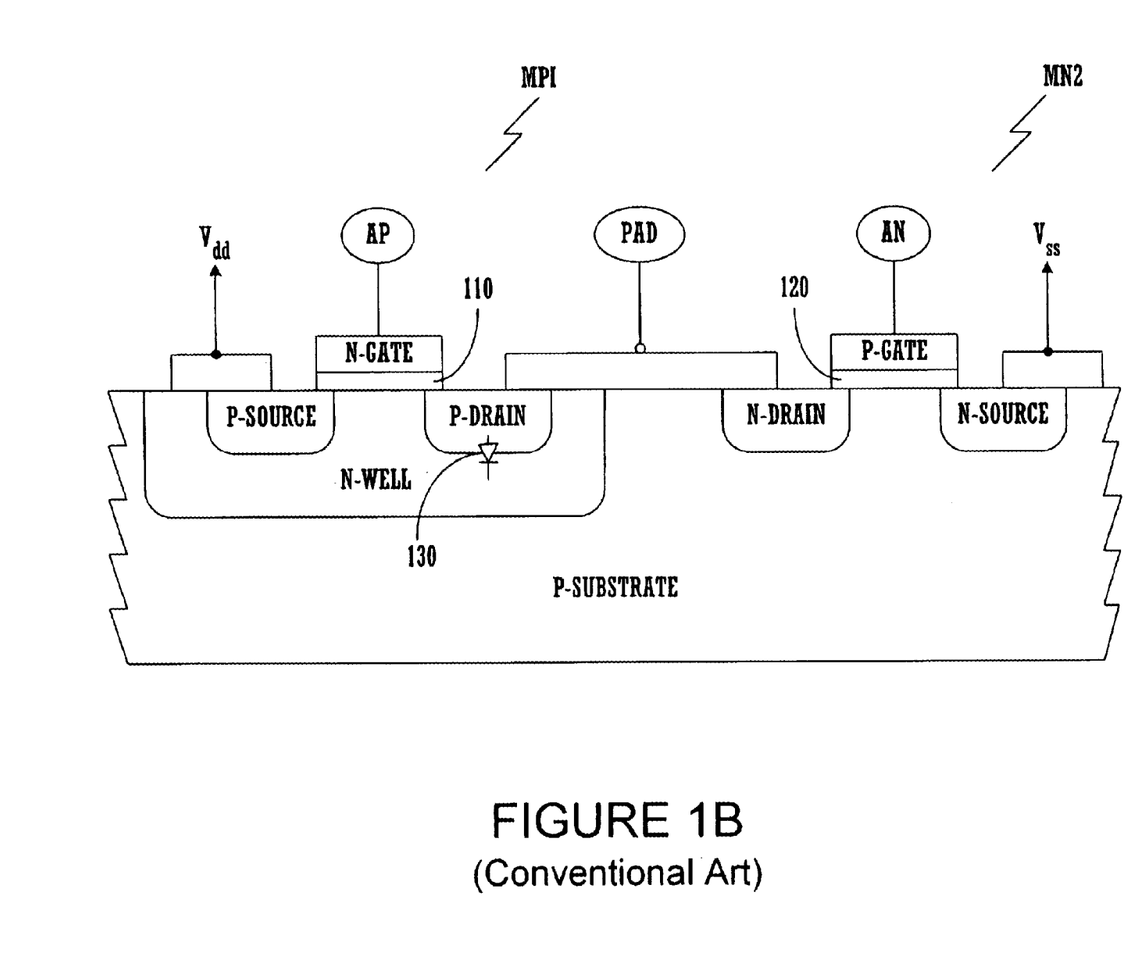
FIG. 1B shows a cross-sectional view of the physical layout of the simplified input/output stage shown in FIG. 1A.

Referring to FIG. 1A, a circuit diagram of a simplified input/output stage, and FIG. 1B a cross-sectional view of the physical layout thereof, according to the conventional art is shown. As depicted in FIG. 1A, the I/O stage comprises a pull-up element MP1 and a pull-down element MN2. The pull-down element MN2 is an n-type metal-oxide-semiconductor field effect transistor (MOSFET), having a source and body coupled to Vss (e.g., a ground terminal), a gate coupled to a pull-down control signal path (AN), and a drain coupled to an input/output terminal (PAD). The pull-up element MP1 is a p-type MOSFET having a source and well coupled to Vdd (e.g., a supply terminal), a gate coupled to a pull-up control signal path (AP), and a drain coupled to the PAD.

During normal conditions, the PAD can be driven high in response to a low signal on AP and AN. The PAD can also be driven low in response to a high signal on AP and AN. Furthermore, the PAD can be driven to a tristate state condition in response to a high signal on AP and a low signal on AN.

During live-insertion conditions, the voltage on the supply, pull-up control signal and pull-down control signal paths are effectively at ground. Therefore, MP1 will be on and provide a current path to Vdd. In such a case, if the current is not limited the drain-well junction will be damaged resulting in failure of the device. When Vpad exceeds a diode drop, a conducting path 130 is also created from the drain of MP1 to the supply terminal, as illustrated in FIG. 1B. If the current is not limited the drain-well junction will be damaged resulting in failure of the device. Furthermore, if Vpad exceeds the breakdown voltage of the gate oxide layer 110 120, the gate oxide layer 110, 120 for either MP1 or MN2 will be damaged resulting in failure of the device.

Accordingly, it is desirable for semiconductor device to protect against junction breakdown due to over-voltage conditions. It is also desirable to be able to remove and/or install subsystems (e.g., replacing one card with another card) without affecting the normal operation of the system (e.g., without powering down the computer).

SUMMARY OF THE INVENTION

Embodiments of the present invention provide a novel drive and biasing circuit for an output circuit of a device. Embodiments of the present invention provide for driving an input/output terminal to a low state, high state, and tri-state (e.g., high impedance) in response to control signals generated by the device. Embodiment of the present invention also provide protection to the output circuit and the rest of the device against voltages appearing on the input/output terminal which are applied when the output circuit does not have power supplied to it.

Embodiments of the present invention provide over-voltage protection by biasing various nodes in the input/output circuit. The nodes are biased such that the voltage present at the PAD terminal (Vpad) does not result in a voltage differential that exceeds the breakdown voltage of the drain-to-gate, source-to-gate, and/or drain-to-source junctions of various transistors in the output circuit. Embodiments of the present invention also provide live-insertion protection by ensuring that current paths from the PAD to various nodes in the circuit are switched off. Thus, embodiments of the present invention advantageously provide both over-voltage protection and live insertion protection.

BRIEF DESCRIPTION OF THE DRAWINGS

The present invention is illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail as not to unnecessarily obscure aspects of the present invention.

Figure 2:
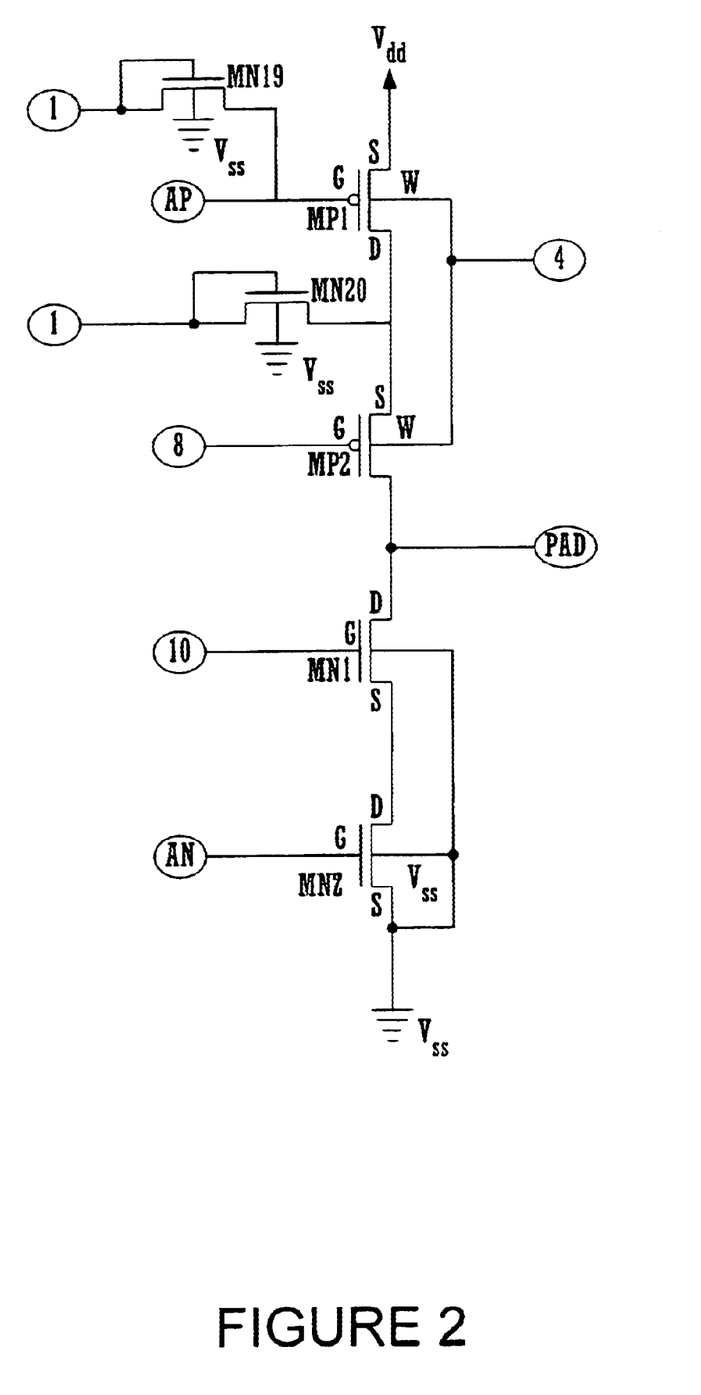
FIG. 2 shows an output portion of an input/output (I/O) stage in accordance with one embodiment of the present invention.

Referring now to FIG. 2, an output portion of an input/output (I/O) stage in accordance with one embodiment of the present invention is shown. As depicted in FIG. 2, the I/O stage comprises a pull-up element MP1, a protection pull-up element MP2, a protection pull-down element MN1, and a pull-down element MN2. The pull-down element MN2 is an n-type metal-oxide-silicon field effect transistor (n-MOSFET), having a source and body coupled to Vss (e.g., a ground terminal), a gate coupled to a pull-down control signal (AN). The protection pull-down element MN1 is an n-MOSFET, having a source coupled to a drain of MN2, a body coupled to Vss, a gate coupled to node 10 (N10), and a drain coupled to a PAD (e.g., an input/output terminal). The protection pull-up element MP2 is a p-type metal-oxide-silicon field effect transistor (p-MOSFET), having a drain coupled to the PAD, a well coupled to node 4 (N4), a gate coupled to node 8 (N8). The pull-up element MP1 is a p-type MOSFET, having a drain coupled to a source of MP2, a well coupled to N4, a gate coupled to a pull-up control signal (AP), and a source coupled to Vdd (e.g., a supply terminal). The I/O stage further comprises two n-MOSFETs MN19 and MN20. MN19 has a drain and gate coupled to node 1 (N1), a body coupled to Vss, and a source coupled to the gate of MP1 (e.g., AP). MN20 has a drain and gate coupled to node 1 (N1), a body coupled to Vss, and a source coupled to the drain of MP1 and the source of MP2.

Figure 3:
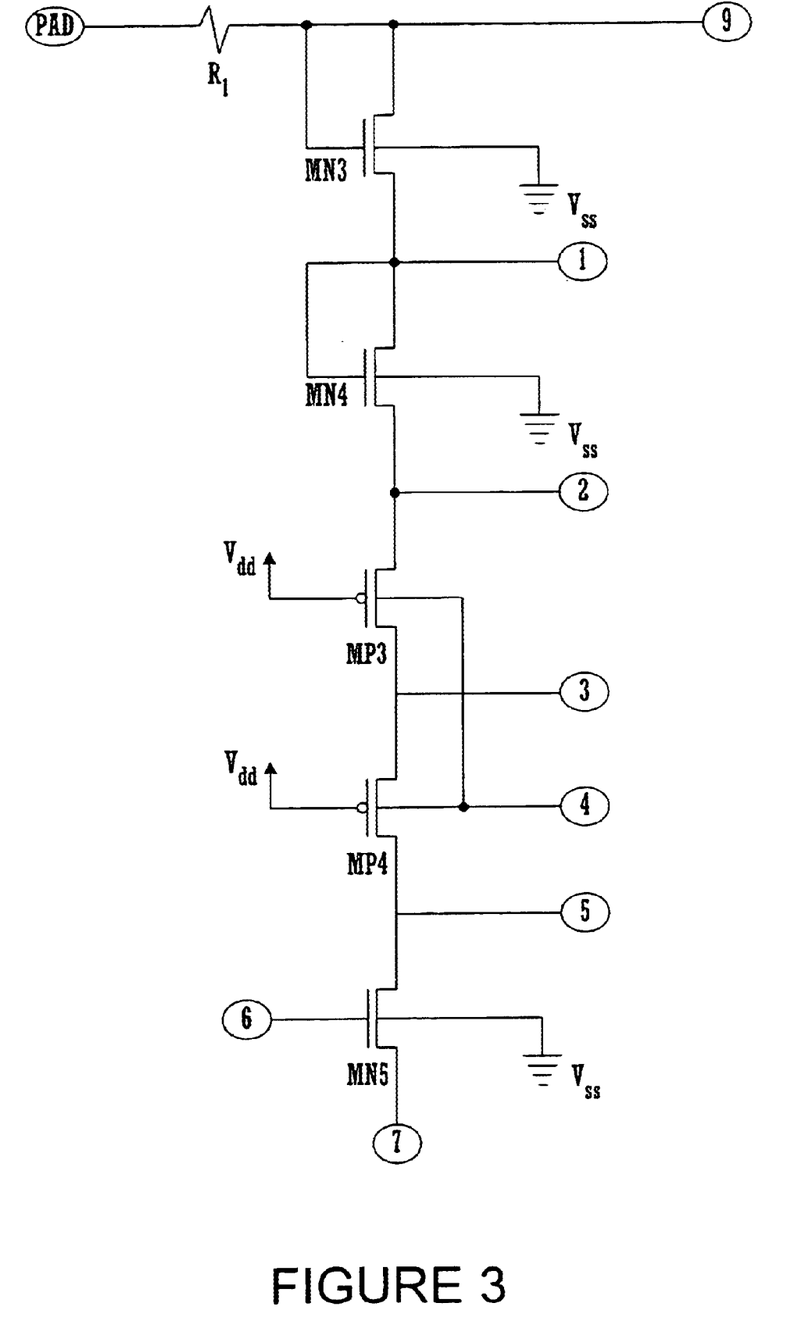
FIG. 3 shows a pull-up protection drive level stage in accordance with one embodiment of the present invention.

Referring now to FIG. 3, a pull-up protection drive level stage in accordance with one embodiment of the present invention is shown. As depicted in FIG. 3, the pull-up protection drive level stage comprises a resistive element R1, three n-MOSFETs MN3, MN4, and MN5, and two p-MOSFETs MP3 and MP4. A first terminal of resistive element R1 is coupled to the PAD. MN3 has a gate and drain terminal coupled to a second terminal of resistive element R1 (e.g., node 9 (N9)), and a body coupled to Vss. MN4 has a gate and drain terminal coupled to a source terminal of MN3 (e.g., node 1 (N1)), and a body coupled to Vss. MP3 has a gate coupled to Vdd, a source coupled a source of MN4 (e.g., node 2 (N2)), and a well coupled to node 4 (N4). MP4 has a gate coupled to Vdd, a source coupled to a drain of MP3 (e.g., node 3 (N3)), and a well coupled to N4. MN5 has a gate coupled to node 6 (N6), a drain coupled to a drain of MP4 (e.g., node 5 (N5)), a body coupled to Vss, and a source coupled to node 7 (N7).

Figure 4:
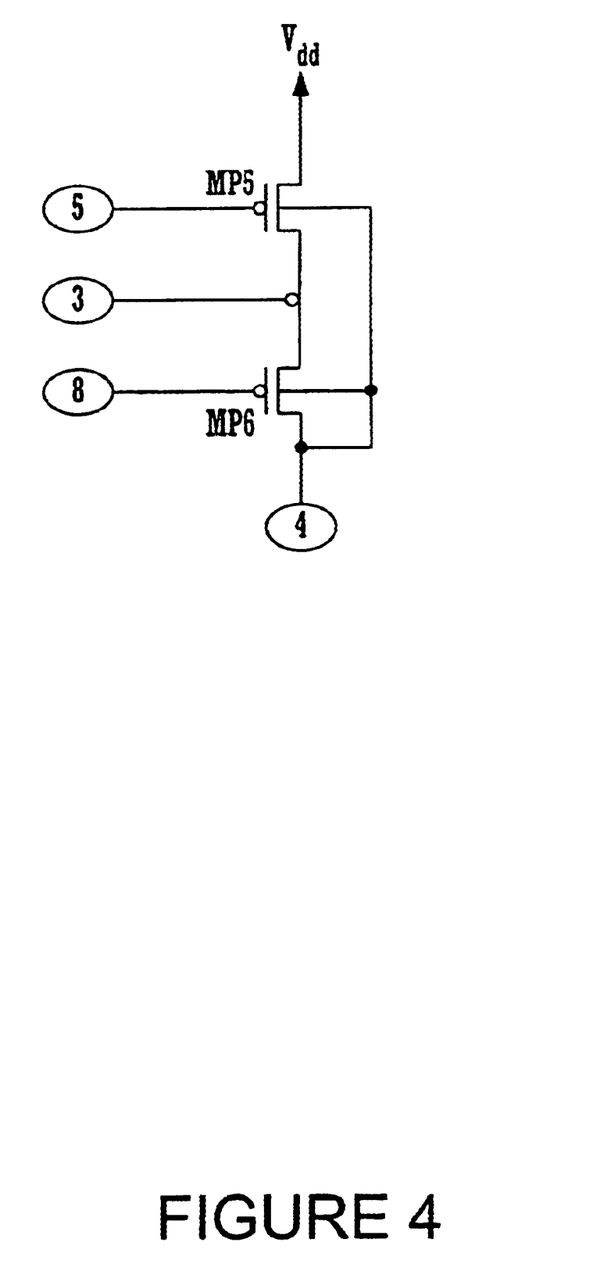
FIG. 4 shows an n-well bias stage in accordance with one embodiment of the present invention.

Referring now to FIG. 4, an n-well bias stage in accordance with one embodiment of the present invention is shown. As depicted in FIG. 4, the n-well bias stage comprises two p-MOSFETs MP5 and MP6. MP5 has a gate coupled to N5, a source coupled to Vdd, and a well coupled to N4. MP6 has a gate coupled to node 8 (N8), a source coupled to a drain of MP5, the drain of MP3 and the source of MP4 (e.g., N3), and a well and drain coupled to N4.

Figure 5:
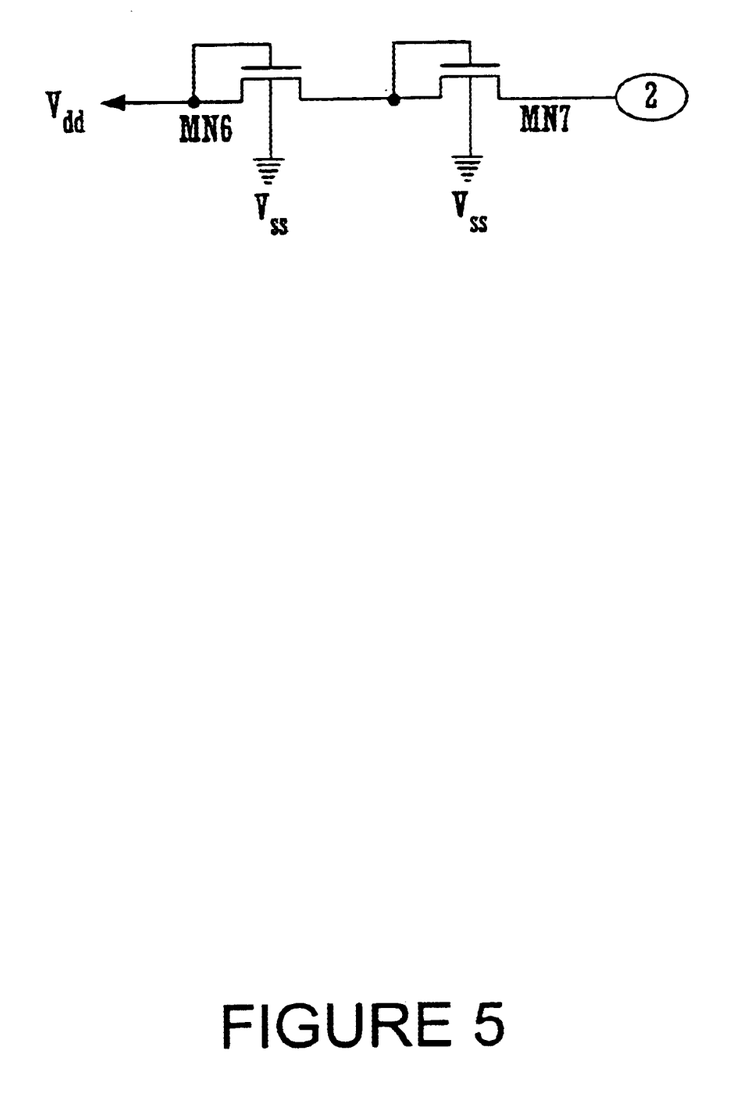
FIG. 5 shows an over voltage protection at node 2 stage in accordance with one embodiment of the present invention.

Referring now to FIG. 5, an over voltage protection at N2 stage in accordance with one embodiment of the present invention is shown. As depicted in FIG. 5, the over voltage protection at N2 stage comprises two n-MOSFETs MN6 and MN7. MN6 has a drain and gate coupled to Vdd, and a body coupled to Vss. MN7 has a drain and gate coupled to a source of MN6, a body coupled to Vss, and a source coupled to N2.

Figure 6:
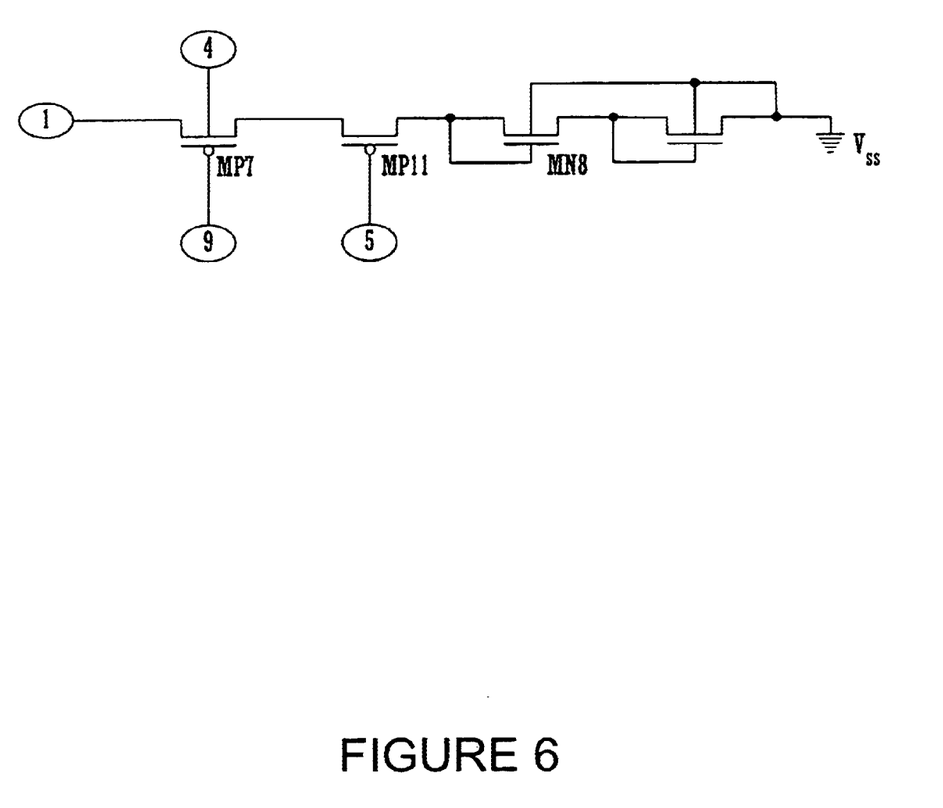
FIG. 6 shows a node 1 discharge path stage in accordance with one embodiment of the present invention.

Referring now to FIG. 6, a N1 discharge path stage in accordance with one embodiment of the present invention is shown. As depicted in FIG. 6, the N1 discharge path stage comprises two p-MOSFETs MP7 and MP11, and two n-MOSFETs MN8 and MN9. MP7 has a source coupled to N1, a gate coupled to N9, and a well coupled to N4. MP11 has a source coupled to a drain of MP7, a gate coupled to N5, and a well coupled to N4. MN8 has a drain and gate coupled to a drain of MP11, and a body coupled to Vss. MN9 has a drain and gate coupled to a source of MN8, and a body and source coupled to Vss.

Figure 7:
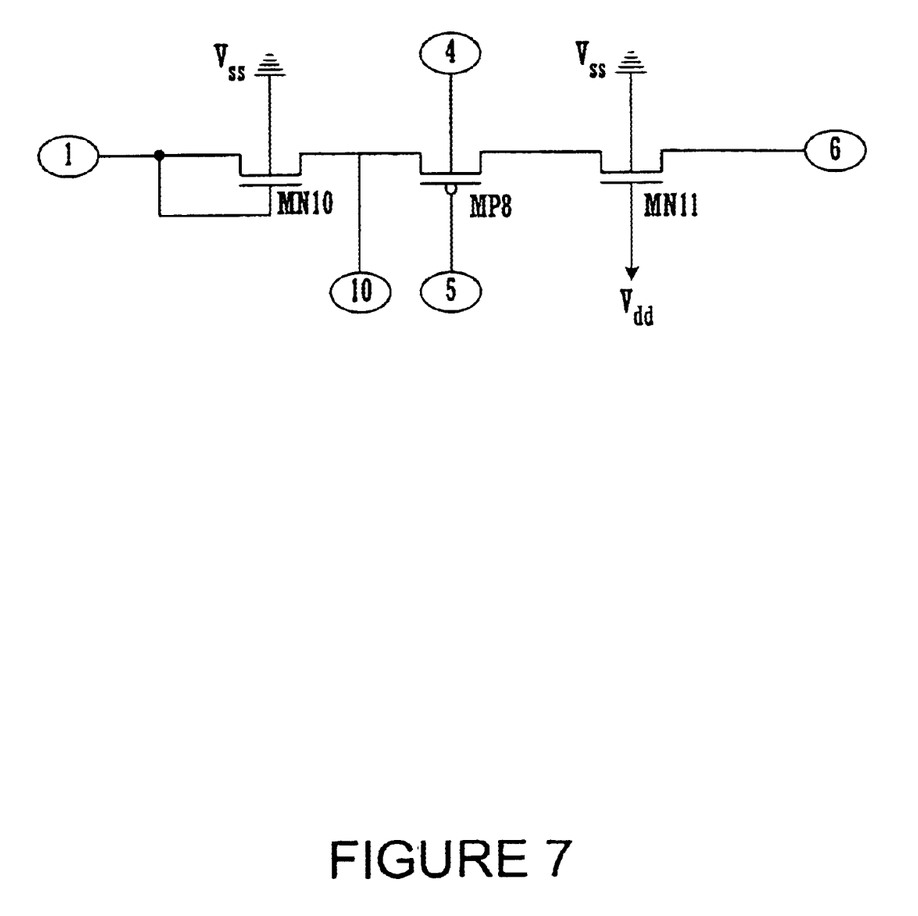
FIG. 7 shows a pull-down protection drive stage in accordance with one embodiment of the present invention.

Referring now to FIG. 7, a pull-down protection drive stage in accordance with one embodiment of the present invention is shown. As depicted in FIG. 7, the pull-down protection drive stage comprises two n-MOSFETs MN10 and MN11, and a p-MOSFET MP8. MN10 has a drain and gate coupled to N1, a body coupled to Vss, and a source coupled to N10. MP8 has a drain coupled to N10, a gate coupled to N5, and a well coupled to N4. MN11 has a source coupled to a source of MP8, a gate coupled to Vdd, a body coupled to Vss, and a drain coupled to N6.

Figure 8:
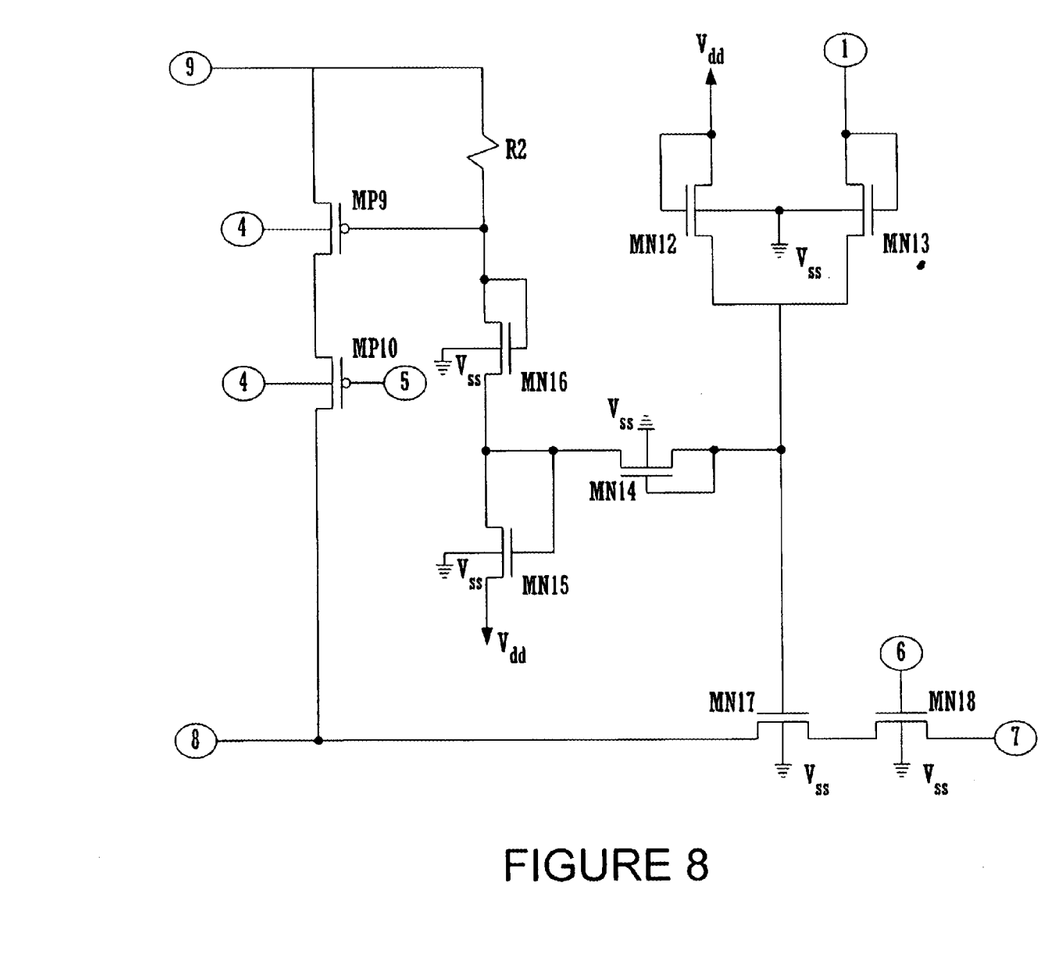
FIG. 8 shows a pull-up protection drive stage in accordance with one embodiment of the present invention.

Referring now to FIG. 8, a pull-up protection drive stage in accordance with one embodiment of the present invention is shown. As depicted in FIG. 8, the pull-up protection drive stage comprises a resistive element R2, two p-MOSFETs MP9 and MP10, and seven n-MOSFETs MN12, MN13, MN14, MN15, MN16, MN17 and MN18. R2 is approximately 40 KΩ. MP9 has a source coupled to N9 and a first terminal of R2, a gate couple to a second terminal of R2, and a well coupled to N4. MP10 has a source coupled to a drain of MP9, a gate coupled to N5, a well coupled to N4, and a drain coupled to N8. MN12 has a drain and a gate coupled to Vdd, and a body coupled to Vss. MN13 has a drain and a gate coupled to N1, and a body coupled to Vss. MN14 has a drain and a gate coupled to a source of MN12 and a source of MN13, and a body coupled to Vss. MN15 has a drain and a gate coupled to a source of MN14, a body coupled to Vss, and a source coupled to Vdd. MN16 has a source coupled to the drain and gate of MN15 and the source of MN14, a body coupled to Vss, and a drain and a gate coupled to the second terminal of R2. MN18 has a drain coupled to N7, a gate coupled to N6, and a body coupled to Vss. MN17 has a drain coupled to a source of MN18, a gate coupled to the source of MN12 and the source of MN13, a body coupled to Vss, and a source coupled to N8.

Normal Operating Conditions

Operation of embodiments of the present invention will be illustrated below for normal operating conditions. Normal operating conditions exist when the supply level is Vdd, and the signal on the PAD swings between Vss and Vdd (e.g., Vdd=3.3V, Vss=0V, Vpad=0V–3.3V). Furthermore, the MOSFETs are fabricated such that the gate oxide layer cannot withstand a potential of more than 2.75V across a gate-to-source, gate-to-drain, and/or drain-to-source junction.

Referring to FIG. 2, during normal output circuit operation MP2 and MN1 should both be turned on (e.g., N8 is low and N10 is high). The PAD can then be driven high in response to a low signal on AP and AN. The PAD can also be driven low in response to a high signal on AP and AN. During normal input circuit operation, the PAD should be in a tri-state condition. Therefore, AP is high and AN is low when PAD acts as an input.

Referring to FIG. 3, the objective of this circuit is to generate a voltage at N5 in such a way that MP5 is turned on and provide the gate-to-source junction of MP5 with protection against breakdown due to an over-voltage condition, during normal operating conditions. N6 is biased at 2.5V and N7 is biased at 1.0V. Therefore MN5 is on, and N5 is driven to 1.0V. MP3 and MP4 are off as a result of having Vdd (e.g., 3.3V) applied to the gate terminals. Thus, the drain of MP3 and source of MP4 present a high impedance to N3. Furthermore, as Vpad increases (e.g., 0V to 3.3V), the potential at N9 increases and therefore MN3 charges N1 toward Vpad-Vt. Where Vt (e.g., 0.5V) is the threshold voltage for turning on MN3.

Referring to FIG. 4, the objective of the circuit is to provide well biasing for the p-MOSFETs, during normal operation. N5 is biased at 1.0V (as described-above with reference to FIG. 3), and therefore MP5 is on resulting in N3 being biased at Vdd (e.g., 3.3V).

Referring to FIG. 5, the objective of the circuit is to protect the gate-to-source junction of MP3 against breakdown due to an over-voltage condition, during normal operation. Both MN6 and MN7 are on, and therefore N2 is biased at Vdd-2Vt. Vdd-2Vt should be less than the maximum junction breakdown voltage of the MOSFETs (e.g. 2.75V). In an exemplary implementation Vdd-2Vt is less than 2.5V, and thus Vt is greater than 0.4V.

Referring to FIG. 6, the objective of the circuit is to provide a discharge path for the voltage at N1, during normal operation to avoid breakdown of MN3 due to over-voltage. The voltage at N1 is charged toward Vpad-Vt as Vpad increases (as described above with reference to FIG. 3), during normal operation. As Vpad decreases (e.g. 3.3V to 0V), the potential at N9 decreases and therefore MP7 turns on, along with MP11, MN8 and MN9. Thus, N1 is discharged from Vpad-Vt when Vpad is at a maximum, to Vt when Vpad is at a minimum.

Referring to FIG. 7, the objective of the circuit is to generate a voltage at N10 in such a way that the pull-down protection element (MN1) is turned on, and the gate-to-source junction of MN1 is protected against breakdown due to an over-voltage condition, during normal operation. N6 is biased at 2.5V and N5 is biased at 1.0V (as described-above with reference to FIG. 3), during normal operation. Therefore, MN11 and MP8 are on, and N10 is driven to 2.5V.

Referring to FIG. 8, the objective of the circuit is to generate a voltage at N8 in such a way that the pull-up protection element (MP2) is turned on, and the gate-to-source junction of MP2 is protected against breakdown due to an over-voltage condition, during normal operation. MN12 is on as a result of Vdd applied to its gate. Therefore, the gate of MN17 is driven to Vdd-Vt, which turns on MN17. MN18 is also on as a result of the bias voltage of 2.5V supplied by N6. MN12 also drives the gate of MN14 to Vdd-Vt. MN16 and MN15 are off because Vpad is less than or equal to Vdd, which is applied to the source of MN15. MN15 is also protected against breakdown due to an over-voltage condition, as a result of Vpad-2Vt applied to its gate by MN14 and MN12. There is no path for current to flow through R2 because MN16 is off, and therefore there is no voltage drop across R2. As a result MP9 is turned off. Thus, MN17 and MN18 drive N8 to 1.0V.

Referring again to FIG. 3, the voltage at N3 will be at Vdd (e.g., 3.3V). Thus, an over-voltage condition will exist if MP3 and MP4 are not used to isolate N3 from N2 and N5. MN5 will pass the voltage present at N7 (e.g., 1.0V) to N5 so there is no over-voltage condition for the drain-to-gate junction of MP4. Furthermore, to insure over-voltage protection for the source-to-gate junction of MP3. the voltage at N2 is forced to Vdd-2Vt (as described-above with reference to FIG. 5).

Referring again to FIG. 4, the bias voltage on N8 of 1.0V (as described-above with reference to FIG. 8), turns on MP6 which drives N4 to Vdd (e.g., 3.3V), during normal operation. N4 supplies the n-well bias voltage to the p-type MOSFETs MP1, MP2, MP3, MP4, MP5, MP6, MP7, MP8, MP9 and MP10. The n-well bias voltage of Vdd (e.g., 3.3V) provides for correct operation of the p-type MOSFETs.

Referring again to FIG. 2, the bias voltage on N8 of 1.0V (as described-above with reference to FIG. 8) also turns on MP2, the protection pull-up element. The bias voltage on N10 of 2.5V (as described-above with reference to FIG. 7), turns on MN1, the protection pull-down element. Hence, the on state of MN1 and MP2 allow the PAD to be driven in response to the control signals AP and AN as described above.

Live-Insertion Operating Condition

Operation of embodiments of the present invention will be illustrated below for live-insertion operating conditions. Live-insertion operating conditions exist when the supply level is off (e.g., Vdd=0V), and there is a signal present on the PAD, which for illustrative purposes will be considered to swing between 0V and 3.3V. A typical example of this is when a subsystem is installed without powering down the system. In such a circumstance the subsystem does not have power prior to receiving a voltage on its input/output terminal (referred to as a live-insertion or hot-pluggable operating condition). Furthermore, the MOSFETs are fabricated such that the gate oxide layer cannot withstand a potential of more than 2.75V across a gate-to-source, gate-to-drain, and/or drain-to-source junction.

Referring to FIG. 3, the objective of the circuit is to generate a voltage at N10 in such a way that the pull-down protection element (MN1) is turned on, and the gate-to-drain junction is protected against breakdown due to an over-voltage condition, during live-insertion. The circuit also provides protection against over-voltage for the gate-to-source junction of MP6. The circuit also generates a voltage at N5 sufficient to turn MP5 off. N6 and N7 are at 0V as a result of the supply voltage being off (e.g., Vdd=0V). Thus, MN5 is turned off. The PAD voltage (Vpad) causes MN3 to charge N1 to Vpad-Vt, where Vt is the threshold voltage for turning on MN3. Likewise, Vpad-Vt at N1 causes MN4 to charge N2 to Vpad-2Vt. Furthermore, MP3 and MP4 are on, as a result of Vdd being 0V. Thus, N3 and N5 are charged to Vpad-2Vt. Vpad-2Vt should be less than the maximum junction breakdown voltage of the MOSFETs (e.g. 2.75V). In an exemplary implementation Vpad-2Vt is less than 2.5V, and thus Vt is greater than 0.4V.

Referring to FIG. 4, the objective of the circuit is to isolate the well of the pull-up protection element MP2 from the supply voltage during normal operation, during live-insertion. MP5 is off as a result of Vdd being 0V and N5 being Vpad-2Vt. Hence N3 is Vpad-2Vt (as described-above with reference to FIG. 3).

Referring to FIG. 5, both MN6 and MN 7 are off as a result of Vdd being 0V. Hence N2 is Vpad-2Vt (as described-above with reference to FIG. 3).

Referring to FIG. 6, the objective of the circuit is to provide a discharge path from N1, during live insertion. The voltage at N1 is charged toward Vpad-Vt as Vpad increases (as described-above with reference to FIG. 3). As Vpad decreases (e.g. 3.3V to 0V), the potential at N9 decreases and therefore MP7 turns on, along with MP11, MN8 and MN9. Thus, N1 is discharged from Vpad-Vt when Vpad is at a maximum, to Vt when Vpad is at a minimum.

Referring to FIG. 7, the objective of the circuit is to pass the voltage generated at N1 to N10 such that the pull-down protection element MN1 is turned on, during live-insertion. MN11 is off as a result of Vdd being 0V. However, MN10 is on due to N1 being Vpad-Vt. Hence, N10 is charge to Vpad-2Vt.

Referring to FIG. 8, the objective of the circuit is to generate a voltage at N8 in such a way that the pull-up protection element MP2 is turned off and the gate-to-drain and gate-to-source junctions are protected against breakdown due to an over-voltage condition, during live-insertion. The circuit also generates a voltage at N8 sufficient to turn MP6 off and protect the gate-to-drain junction against breakdown due to an over-voltage condition. MN12 is off as a result of Vdd being 0V. However, MN13 is on as a result of Vpad-Vt on N1 applied to its gate. Therefore, the gate of MN14 is driven to Vpad-2Vt, which turns on MN14, MN15 and MN16. Turning on MN15 and MN16 causes current to flow through R2, which turns on MP9. MP9 provides Vpad to the source of MP10. MP10 is on because of the PAD-2Vt biasing provided by N5. As a result MP8 will drive N8 to Vpad. Furthermore, MN18 is off as a result of Vdd being 0V.

Referring again to FIG. 4, the bias voltage on N8 of Vpad (as described-above with reference to FIG. 8) turns off MP6. Therefore, MP6 presents a high impedance to node N4.

Referring again to FIG. 2, the bias voltage on N8 of Vpad also turns off MP2, the protection pull-up element. Turning off MP2 during live-insertion conditions prevents the signal on the PAD from being applied to the pull-up element MP1. The bias voltage on N8 also prevents the drain-to-gate voltage on MP2 from exceeding the dielectric breakdown voltage of the gate oxide layer. MP20 provides Vpad-2Vt to the source of MP2 to prevent source-to-gate breakdown. However, the circuit must ensure that MP1 is turned off so that no leakage current flows through MP1 as a result of the source of MP2 being biased at Vpad-2Vt by MP20. Therefore, MP19 provides Vpad-2Vt to the gate of MP1 during live-insertion. Furthermore, the drain of MP2 receives Vpad, which forward biases the p-n junction formed by the p-type drain and the n-type well of MP2. As a result, N4 is charge to Vpad-Vd, where Vd is the forward diode drop voltage (e.g., 0.6V). However MP6 prevents current flow from the PAD, through the well of MP2, to the supply source Vdd. The bias voltage on N10 of Vpad-2Vt turns on MN1, the protection pull-down element. However, the pull-down element MN2 will be off as a result of Vdd being 0V. The junctions of MN2 will not be readily susceptible to breakdown, because the maximum voltage at the source of MN1 will be Vpad-3Vt. Furthermore, the bias voltage on N10 of Vpad-2Vt also prevents the drain-to-gate voltage on MN1 from exceeding the dielectric breakdown voltage of the gate oxide layer.

Thus, during over-voltage operation, embodiments of the present invention as described-above turn off the protection pull-up transistor MP2. Embodiments of the present invention also prevent breakdown of the gate oxide layers of pull-up protection transistor MP2 and pull-down protection transistor MN1. Embodiments of the present invention also shut off the current path from the PAD through the well terminal of the protection pull-up element MP2.

During live-insertion operation, embodiments of the present invention as described-above turn off the protection pull-up transistor MP2. Embodiments of the present invention also prevent breakdown of the gate oxide layers of pull-up protection transistor MP2 and pull-down protection transistor MN1. Embodiments of the present invention also shut off current paths from the PAD through the well terminal of the protection pull-up element MP2 and through the pull-up element MP1. Embodiments of the present invention also protect the pull-down element MN2 from junction breakdown voltage levels.

Figure 9:
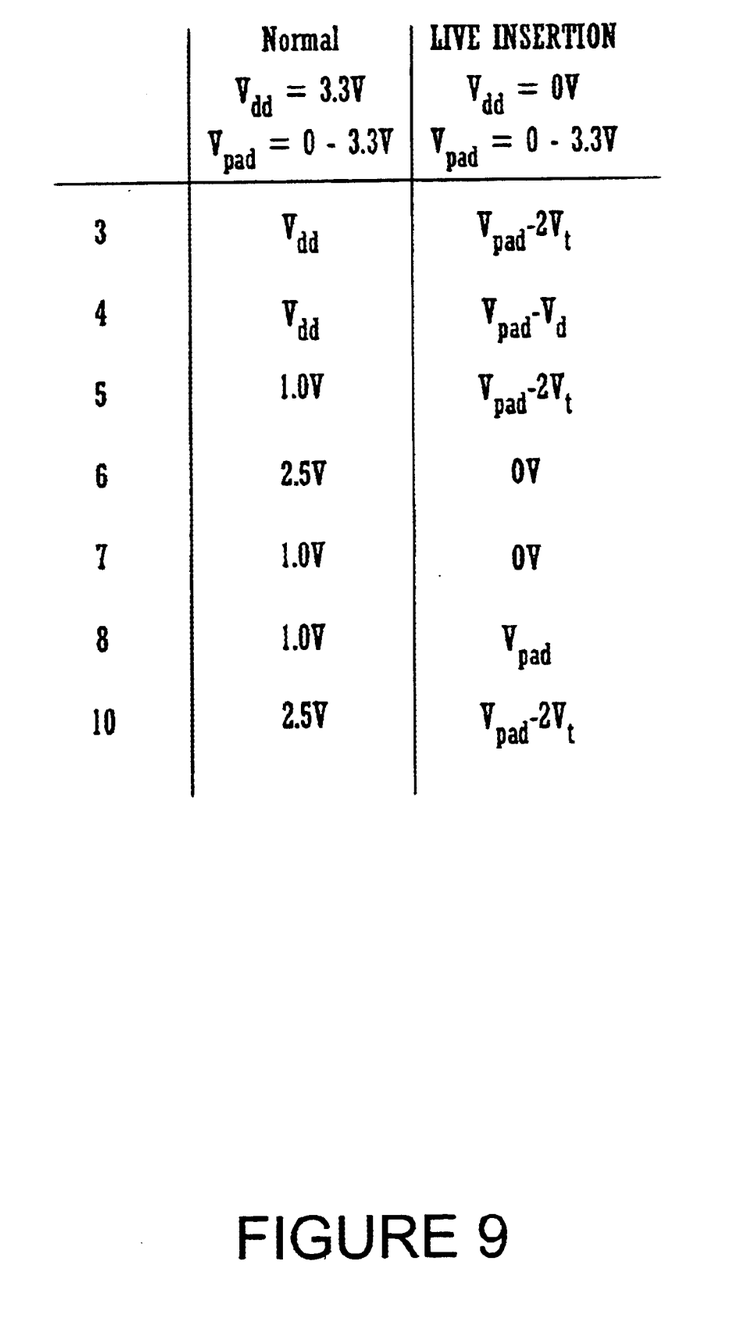
FIG. 9 shows a table of node voltages for normal and live-insertion operating conditions in accordance with embodiment of the present invention.

Referring now to FIG. 9, a table of node voltages for normal and live-insertion operating conditions in accordance with embodiment of the present invention is shown. The table summarizes various node voltages for normal and live-insertion operating conditions, of the above-described circuits for implementing embodiments of the present invention.

Figure 10:
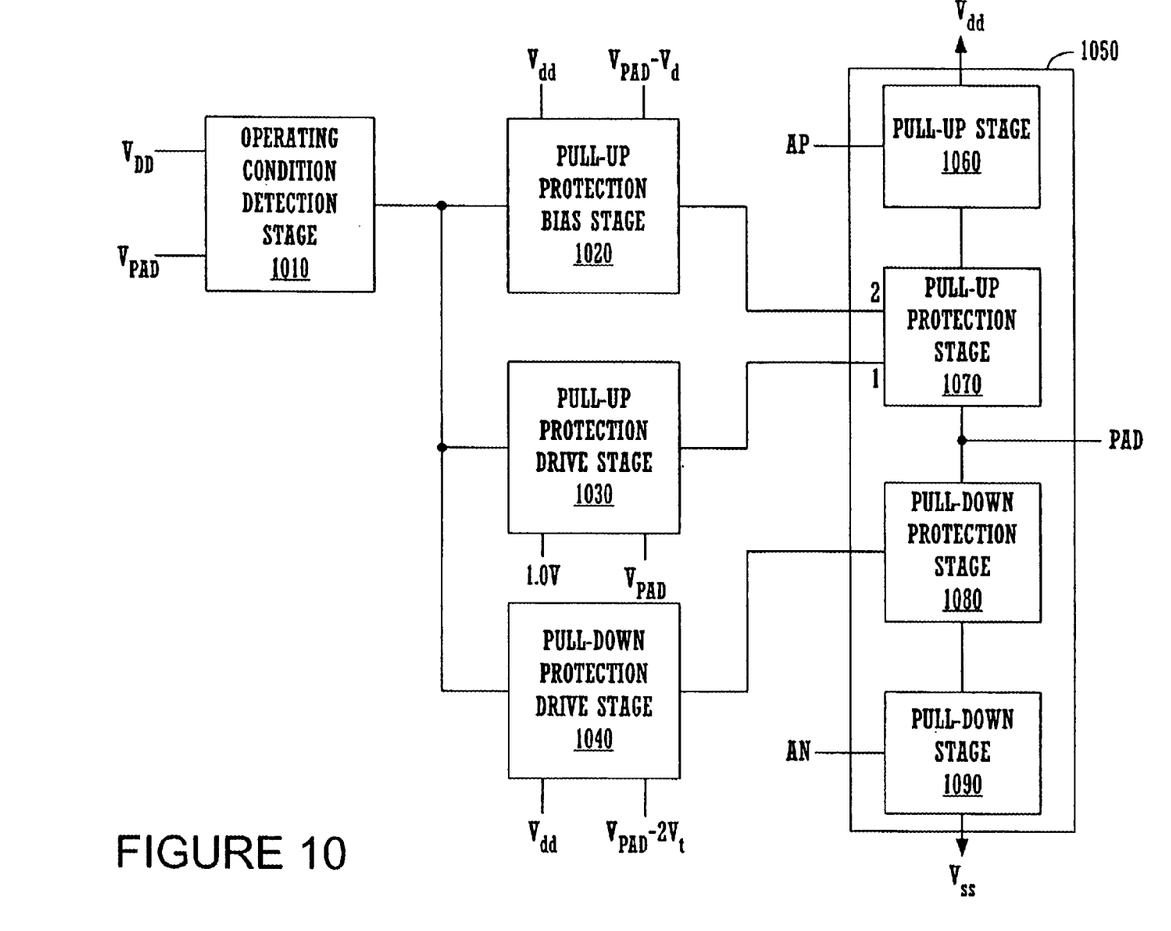
FIG. 10 shows a block diagram of a live-insertion protection circuit in accordance with one embodiment of the present invention.

Referring now to FIG. 10, a block diagram of a live-insertion protection circuit in accordance with one embodiment of the present invention is shown. As depicted in FIG. 10, the circuit comprises an operating condition detection stage 1010 coupled to a pull-up protection bias stage 1020, a pull-up protection drive stage 1030, and a pull-down protection drive stage 1040.

The circuit also includes a input/output stage 1050, which comprises: A pull-up stage 1060 for selectively coupling a supply voltage (Vdd) to an input/output terminal (PAD) in response to a pull-up control signal (AP). A pull-up protection stage 1070 for coupling the pull-up stage 1060 to the PAD in response to a first drive signal received on a first terminal. The pull-up protection stage 1070 also receives a bias signal on a second terminal from the pull-up protection bias stage 1020. A pull-down stage 1090 for selectively coupling a ground voltage (Vss) to the PAD in response to a pull-down control signal (AN). A pull-down protection stage 1080 for coupling the pull-down stage 1090 to the PAD in response to a second drive signal.

The operating condition detection stage 1010 detects the presence of normal or live-insertion operating conditions from the voltage levels present on the PAD (Vpad) and the supply source Vdd. The operating condition detection stage 1010 controls the operation of the pull-up protection bias stage 1020, the pull-up protection drive stage 1030, and the pull-down protection drive stage 1040.

When a normal operating condition is detected, the operating condition detection stage 1010 causes the pull-down protection drive stage 1040 to output the second drive signal having a level (e.g., Vdd) sufficient to turn on the pull-down protection stage 1080, and to protect the pull-down protection element 1080 against over-voltage conditions. As a result the pull-down stage 1090 is coupled to the PAD during normal operating conditions. When a live-insertion operating condition is detected, the operating condition detection stage 1010 causes the pull-down protection drive stage 1040 to output the second drive signal having a level (e.g., Vpad-2Vt) sufficient to turn on the pull-down protection stage 1080, and to protect the pull-down protection stage 1080 against over-voltage conditions. As a result the pull-down stage 1090 is coupled to the PAD during live-insertion operating conditions.

Furthermore, when a normal operating condition is detected, the operating condition detection stage 1010 also causes the pull-up protection drive stage 1030 to output the first drive signal having a level (e.g., 1.0V) sufficient to turn on the pull-up protection stage 1070, and to protect the pull-up protection stage 1070 against over-voltage conditions. As a result the pull-up stage 1060 is coupled to the PAD during normal operating conditions. When a live-insertion operating condition is detected, the operating condition detection stage 1010 causes the pull-up protection drive stage 1030 to output the first drive signal having a level (e.g., Vpad) sufficient to turn off the pull-up protection stage 1070, and to protect the pull-up protection stage 1070 against over-voltage conditions. As a result the pull-up stage 1060 is de-coupled from the PAD during live-insertion operating conditions.

In addition, when a normal operating condition is detected, the operating condition detection stage 1010 causes the pull-up protection bias stage 1020 to output the bias signal having a level of substantially Vdd to the pull-up protection stage 1070. When a live-insertion operating condition is detected, the operating condition detection stage 1010 causes the pull-up protection bias stage 1030 to output the bias signal having a level of substantially Vpad (e.g., Vpad-Vd) to the pull-up protection stage 1070.

Accordingly, the present embodiment of the invention provides for driving PAD high, low, or placing the PAD into a tri-state, during normal operating conditions. The present embodiment also turns off a first current path through the pull-up protection stage 1070 during live-insertion operating conditions. The present embodiment also turns off a second current path through the pull-up protection stage 1070 and pull-up stage 1060 during live-insertion operating conditions. The present embodiment also protects against over-voltage conditions in the pull-up protection stage 1070 and the pull-up stage 1060, during live-insertion operating conditions. The present embodiment also protects against over-voltage conditions in the pull-down protection stage 1080 during over-voltage operating conditions.

Although embodiments of the present invention were described above with reference to a supply voltage Vdd of 3.3V wherein the MOSFETs are fabricated to withstand no more than 2.75 across any one junction, those skilled in the art will appreciated that similar analysis is applicable to implementations of the present invention having supply voltages Vdd of 5V, 2.5V, 1.8V, and the like, when the MOSFETs are fabricated to withstand less than the supply voltage level across any one junction.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An output stage comprising:
   a first circuit for substantially feeding a voltage received at an output terminal back to a gate of a pull-up protection transistor during a live-insertion condition;
   a second circuit for substantially feeding the voltage received at the output terminal back to a well of the pull-up protection transistor during the live-insertion condition; and
   a third circuit for substantially feeding the voltage received at the output terminal back to a gate of a pull-down protection transistor during the live-insertion condition; and
   a fourth circuit for substantially feeding a voltage that is substantially one diode drop less than the voltage received at the output terminal during the live-insertion condition, wherein a current path through the pull-up protection transistor is turned off.

2. The output stage according to claim 1, wherein a gate oxide layer of the pull-up protection transistor is protected against breakdown.

3. The output stage according to claim 1, wherein a current path through a drain-to-source of a pull-up transistor is turned off.

4. The output stage according to claim 1, wherein a gate oxide layer of the pull-down protection transistor is protected against breakdown.

5. The output stage according to claim 1, wherein a drain-to-source junction of a pull-down transistor is protected against breakdown.

6. An input/output circuit comprising:
   a pull-up protection drive stage coupled to a pull-up protection element which provides a first low voltage during normal operating conditions, and a first high voltage level during live-insertion operating conditions;
   a pull-down protection drive stage coupled to a pull-down protection element which provides a second high voltage during normal operating conditions, and a third high voltage level during live insertion operating conditions; and
   an n-well bias stage coupled to the pull-up protection element, which provides a forth high voltage during normal operating conditions, and a fifth high voltage level during over-voltage and live insertion operating conditions, wherein the forth high voltage is substantially equal to a supply voltage, and wherein the fifth high voltage is substantially one diode drop less than the voltage level present on the input out/put terminal.

7. The input/output circuit according to claim 6, wherein the first low and first high voltage protect the pull-up protection element against breakdown during over-voltage conditions.

8. The input/output circuit according to claim 6, wherein the second high and third high voltage protect the pull-down protection element against breakdown during over-voltage conditions.

9. The input/output circuit according to claim 6, wherein the first high voltage level is substantially equal to a voltage level present on the input/output terminal.

10. The input/output circuit according to claim 6, wherein the third high voltage level is substantially two threshold voltage levels less than the voltage level present on the input/output terminal.

11. The input/output circuit according to claim 6, further comprising:

the pull-up protection element for coupling a pull-up element to an input/output terminal in response to the first low voltage, and for isolating the pull-up element from the input/output terminal in response to the first high voltage level; and the pull-down protection element for coupling a pull-down element to the input/output terminal in response to the second or the third high voltage level.

12. The input/output circuit according to claim 11, wherein isolating the pull-up element from the input/output terminal during live-insertion interrupts a first current path from the input/output terminal through the pull-up protection element and the pull-up element.

13. The input/output circuit according to claim 6, wherein the fifth high voltage interrupts a second current path from the input/output terminal through the pull-up protection element.

14. A method of providing over-voltage and live-insertion protection comprising:

biasing a pull-up protection element at a supply level during a normal operating condition, and at substantially a voltage level present on an input/output terminal during a live-insertion operating condition;

biasing a body of the pull-up protection element at the supply level during a normal operating condition, and at substantially one diode drop less than the voltage level present on the input/output terminal during a live-insertion operating condition wherein a current path through said pull-up protection element is interrupted;

driving the pull-up protection element at a low voltage level during the normal operating condition, and at substantially the voltage level present on the input/output terminal during the live-insertion operating condition;

driving a pull-down protection element at the supply level during a normal operating condition, and at substantially the voltage level present on the input/output terminal during the live-insertion operating condition.

15. The method according to claim 14, wherein biasing the pull-up protection element turns off a first current path during live-insertion operating conditions.

16. The method according to claim 14, wherein driving the pull-up protection element protects against a junction breakdown due to an over-voltage condition.

17. The method according to claim 14, wherein driving the pull-down protection element protects against a junction breakdown due to an over-voltage condition.

* * * * *